(12) United States Patent
Li et al.

(10) Patent No.: US 11,296,263 B2
(45) Date of Patent: Apr. 5, 2022

(54) WAVELENGTH CONVERSION APPARATUS

(71) Applicant: APPOTRONICS CORPORATION LIMITED, Shenzhen (CN)

(72) Inventors: Qian Li, Shenzhen (CN); Fei Hu, Shenzhen (CN); Yangang Wang, Shenzhen (CN); Yanzheng Xu, Shenzhen (CN)

(73) Assignee: APPOTRONICS CORPORATION, Shenzhen (CN)

( * ) Notice: Subject to any disclaimer, the term of this patent is extended or adjusted under 35 U.S.C. 154(b) by 0 days.

(21) Appl. No.: 16/960,685

(22) PCT Filed: Mar. 28, 2018

(86) PCT No.: PCT/CN2018/080878
§ 371 (c)(1),
(2) Date: Oct. 2, 2020

(87) PCT Pub. No.: WO2019/136830
PCT Pub. Date: Jul. 18, 2019

(65) Prior Publication Data
US 2021/0013384 A1  Jan. 14, 2021

(30) Foreign Application Priority Data

Jan. 10, 2018 (CN) .......................... 201810021961.9

(51) Int. Cl.
*H01L 33/50* (2010.01)
*F21K 9/64* (2016.01)

(52) U.S. Cl.
CPC .............. *H01L 33/505* (2013.01); *F21K 9/64* (2016.08)

(58) Field of Classification Search
CPC ..... H01L 33/505; H01L 33/50; H01L 33/501; F21K 9/64; F21K 9/20; F21K 9/68; F21Y 2115/30
See application file for complete search history.

(56) References Cited

U.S. PATENT DOCUMENTS

2016/0266375 A1  9/2016  Li et al.

FOREIGN PATENT DOCUMENTS

CN    203489180 U    3/2014
CN    103887294 A    6/2014
(Continued)

OTHER PUBLICATIONS

Int'l. Search Report for PCT/CN2018/080878, dated Oct. 11, 2018.
(Continued)

*Primary Examiner* — Joseph L Williams
*Assistant Examiner* — Jose M Diaz
(74) *Attorney, Agent, or Firm* — Blue Filament Law

(57) ABSTRACT

Provided is a wavelength conversion apparatus that includes a metal substrate; and a light-emitting ceramic layer. The light-emitting ceramic layer is used for absorbing excitation light and emitting excited light having a wavelength different from that of the excitation light. A metal reflective layer and a silica gel layer are stacked between the metal substrate and the light-emitting ceramic layer, and the reflective layer is used for reflecting the excited light and an unconverted part of the excitation light. The wavelength conversion device can reduce heat generated in the wavelength conversion apparatus, while realizing an aim of emitting excited light having a high illumination intensity in the wavelength conversion apparatus.

11 Claims, 3 Drawing Sheets

(56) References Cited

FOREIGN PATENT DOCUMENTS

| | | |
|---|---|---|
| CN | 104566230 A | 4/2015 |
| CN | 204420881 U | 6/2015 |
| CN | 105805699 A | 7/2016 |
| CN | 105914288 A | 8/2016 |
| CN | 106468427 A | 3/2017 |
| CN | 106811197 A | 6/2017 |
| CN | 205374967 U | 7/2017 |
| CN | 107001931 A | 8/2017 |
| CN | 206669352 U | 11/2017 |
| WO | 2012040046 A1 | 3/2012 |

OTHER PUBLICATIONS

First Office Action issued in corresponding Chinese Patent Appln. No. 201810021961.9, dated Jun. 2, 2020.
Supplementary EP Search Report issued in corresponding Chinese Patent Appln. No. 18900101.9, dated Nov. 4, 2021.

WAVELENGTH CONVERSION APPARATUS

TECHNICAL FIELD

The present disclosure relates to a wavelength conversion device.

BACKGROUND

In the field of illuminating display, laser light sources have become a research and development hotspot in recent years. However, due to low photoelectric conversion efficiencies of red laser light and green laser light, costs of the red laser light and the green laser light have remained high, such that laser light sources emitting red, green, and blue laser light haven't been accepted by markets yet.

In order to replace the laser light sources above, a wavelength conversion technology that adopts laser light to excite a fluorescent material to generate visible light has developed rapidly. Researchers in this field are surprised to find that this technology is not only cost efficient, but also has great advantages compared to the above pure laser light sources. For example, excited light generated by the fluorescent material under the excitation of the laser light has more wavelength ranges for selection, so as to obtain a wider spectral characteristic. The wide spectral characteristic of the excited light makes it more suitable for application in the field of the illuminating display, thereby having a higher color rendering index. In addition, since the excitation light source and the fluorescent material are disposed apart from each other in this technology, a fluorescent light-emitting body is not restricted by wires and circuits, making it more beneficial to heat dissipation and optical path designs.

In order to obtain light emission having higher brightness in the above technology, the most direct way is to increase an optical power density of the light incident on the fluorescent material. However, since heat will be generated during the process in which the fluorescent material absorbs the excitation light and emits the excited light, increase of the optical power density of the excitation light will result in that the heat generated by the fluorescent material cannot dissipate in time, thereby causing heat accumulation, which may change activity of the fluorescent material and produce a thermal quenching effect, thereby reducing light-emitting performance of the fluorescent material.

Therefore, in order to obtain light emission with high brightness, not only the optical power density of light incident on the fluorescent material needs to be increased, but it is also required that the structure adopting the fluorescent material shall have excellent heat dissipation performance. In addition, essential characteristics of the technology further include high temperature resistance of the fluorescent material, otherwise the fluorescent material cannot withstand the high instantaneous temperature under laser light irradiation.

In order to improve the heat resistance, in the related art, adhesive of phosphor powder in the light-emitting layer is replaced from organic silica-gel to inorganic glass powder or ceramic powder. However, thermal conduction capability of the inorganic glass powder or the ceramic powder itself are relatively poor, even worse than the organic silica-gel.

In addition, in order to improve the heat dissipation performance, a structure is proposed in the related art in which the fluorescent material is coated on a rotating wheel to be excited and irradiated in sequence.

In order to speed up heat exchange for better heat dissipation, a structure is also proposed in the related art in which heat dissipation fins are provided at bottom of the rotating wheel in order to increase the heat exchange area. However, improvement of these heat dissipation technologies focuses on treatment of heat after the heat leaves the fluorescent material layer, and mainly aims at heat dissipation issues of layers directly connected to the fluorescent material layer, such as a reflective substrate. However, as energy of the excitation light continues to increase, a fluorescent color wheel based on the above structures of the related art has to increase a radius of the rotating wheel in order to maintain the heat dissipation effect. Therefore, such structure is not beneficial to structural designs of illuminating display devices such as light sources and projection apparatus.

SUMMARY

Based on the above solutions to the "heat" problems in the related art, it can be seen that an idea aiming at this problem in the related art is mainly limited to how to dissipate heat. Whether increasing the thermal conduction capability of the wavelength conversion device or adding an external heat dissipation device that can speed up the heat exchange between the wavelength conversion device and the outside, the root of "generating the heat" is never considered in the related art.

Starting with the problem of heat generation and aiming at the problem of how to increase the reflectivity, the inventor of the present disclosure considers reducing the heat generated in the wavelength conversion device in combination with improving the heat dissipation performance of the light-emitting layer itself, so as to achieve the object of emitting excited light with a high illumination intensity in the wavelength conversion device.

Based on the above object, the present disclosure is expected to provide a wavelength conversion device, which includes: a metal substrate; and a light-emitting ceramic layer configured to absorb excitation light and emit excited light having a wavelength different from the excitation light, wherein a metal reflective layer and a silica-gel layer are stacked between the metal substrate and the light-emitting ceramic layer, and the reflective layer is configured to reflect the excited light and a part of the excitation light which is not converted.

Through the above technical solutions, the present disclosure solves the heat problem of the wavelength conversion device from the root of "generating the heat", and can obtain following beneficial effects:

1. Since the light-emitting layer adopts a ceramic structure, its thermal stability and thermal conduction capability are far superior to a phosphor layer using glass or silica-gel as a matrix in the prior art, such that uniform temperature distribution on a backlight surface can be achieved and irradiation of high-power excitation light is tolerable;

2. The light-emitting layer adopts a light-emitting ceramic layer resulting in a surface having relatively small roughness, which is beneficial to using a thin silica-gel layer to connect with the metal substrate, thereby avoiding the demand of controlling the thickness of the silica-gel;

3. Since during a heat transfer process of the present disclosure, it is not necessary to pass through layer structures such as "a thermal conductive ceramic layer" provided for firmly bonding with the light-emitting layer in the prior art, the heat dissipation path can be simplified and the heat dissipation performance can be improved;

4. Since the present disclosure adopts a metal reflective layer, the heat dissipation performance can be improved while increasing the reflectivity, thereby achieving the object of emitting high light illumination intensity in the wavelength conversion device;

5. Since the light-emitting ceramic layer itself has excellent thermal conduction capability, the heat can rapidly spread with the light spot being the center, in order to prevent the heat generated in the light-emitting layer from being concentrated in the silica-gel layer and thereby destroying the chemical structure of the silica-gel;

6. Since the metal reflective film layer is sealed by the silica-gel layer and the metal substrate, the oxidation rate of the metal reflective layer can be reduced, thereby increasing the service life of the wavelength conversion device.

It should be understood that the beneficial effects of the present disclosure are not limited to the above effects but may be any beneficial effects described herein.

DESCRIPTION OF EMBODIMENTS

Figure 1:
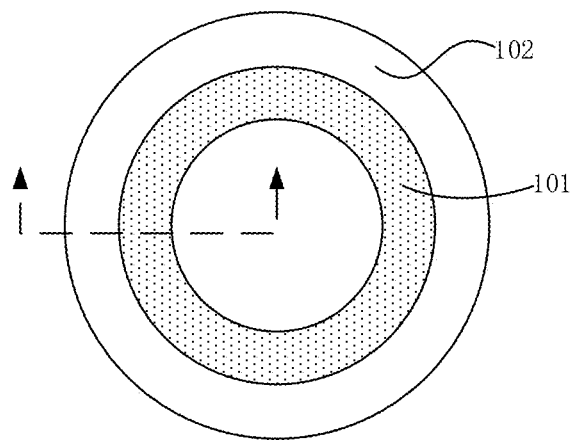
FIG. 1 is a top plan view of a wavelength conversion device adopted in accordance with the present disclosure.

Hereinafter, various specific embodiments according to the present disclosure will be described in detail with reference to the accompany drawings. It should be emphasized that all dimensions in the accompany drawings are only schematic and not necessarily shown in actual scale, so as not to constitute any limitation. For example, it should be understood that dimensions, ratios, and angles of components such as a reflective layer, a light-emitting layer, and a substrate in the illustrations are not shown according to actual dimensions and ratios, and they are only for convenience of illustration but not for limiting the specific scope of the present disclosure.

The wavelength conversion device of the present disclosure includes a light-emitting ceramic layer, a metal reflective layer, a silica-gel layer and a substrate. The light-emitting ceramic layer is located above the baseplate, and the metal reflective layer and the silica-gel layer are arranged between the light-emitting ceramic layer and the baseplate. Detailed introduction of each part is as below.

<Wavelength Conversion Device>

The wavelength conversion device is configured to convert excitation light from a light source into excited light having a wavelength different from the excitation light, and it can be a wavelength conversion device in a form of a color wheel, or a fixed wavelength conversion device. In the wavelength conversion device in a form of a color wheel, a motor drives the color wheel to rotate, thereby changing the position of a light spot of the excitation light on the color wheel. In the fixed wavelength conversion device, the position of the light spot of the excitation light on the device does not change.

<Light-Emitting Ceramic Layer>

The light-emitting ceramic layer is the part of the wavelength conversion device for receiving irradiation of the excitation light and converting the excitation light into the excited light having a wavelength different from the excitation light. The excitation light here may be light emitted by a solid-state light source, such as light from an LED, light from a laser diode, and laser light, or it can be any other light source light disclosed before the application date of the present disclosure. In the present disclosure, a light-emitting ceramic layer having a single-layer structure is adopted.

Since the light-emitting ceramic layer is a ceramic structure whose thermal stability and thermal conduction capability are far superior to a phosphor layer using glass or silica-gel as a matrix in the prior art (that is, the phosphor is encapsulated in continuous glass or silicone), such that it can withstand irradiation of high-power excitation light and be applied to the field of high-brightness laser phosphor illumination/display.

The light-emitting ceramic layer may be a pure-phase phosphor ceramic, and it can be various oxide ceramics, nitride ceramics or oxynitride ceramics, in which a light-emitting center is formed by doping a minor amount of activator elements such as lanthanides in the preparation process of the ceramic. For example, YAG phosphor ceramic is used in the present disclosure. In some embodiments of the present disclosure, the light-emitting ceramic layer is Ce-doped YAG ceramic, which for example is formed of $Y_2O_3$, $Al_2O_3$ and $CeO_2$ powder by processing such as uniform mixing, tabletting, cold isostatic pressing, sintering and the like; in other embodiments of the present disclosure, the light-emitting ceramic layer is Ce-doped LuAG ceramic.

In another embodiment, the light-emitting ceramic layer may also be a composite ceramic layer in which a transparent/semitransparent ceramic is used as a matrix and light-emitting ceramic particles such as phosphor particles are distributed in the ceramic matrix. The transparent/semitransparent ceramic matrix can be various oxide ceramics such as alumina ceramics or $Y_3Al_5O_{12}$ ceramics, nitride ceramics such as aluminum nitride ceramics, or oxynitride ceramics. The ceramic matrix functions to conduct light and heat, so that the excitation light can be incident on the light-emitting ceramic particles, and the excited light can be emitted from the light-emitting ceramic layer. The light-emitting ceramic particles assume a main part of light-emitting function of the light-emitting ceramic layer, and is configured for absorbing the excitation light and converting it into the excited light.

Further, the light-emitting ceramic layer above may further include scattering particles distributed in the ceramic matrix and capable of scattering visible light. The scattering particles function to enhance the scattering of the excitation light in the light-emitting ceramic layer, so as to increase an optical length of the excitation light in the light-emitting ceramic layer, so that a light utilization rate of the excitation light is greatly improved, and the light conversion efficiency of the light-emitting ceramic layer is improved as well.

The scattering particles may be scattering particles of materials such as alumina, yttria, zirconia, lanthanum oxide, titanium oxide, zinc oxide, barium sulfate, etc., and they can be formed of a single material or a combination of two or more materials. Since its component materials are stable, it can withstand high temperature. The scattering particles are white particles in appearance, and particle sizes thereof are in the same order of magnitude or one order of magnitude lower than the wavelength of the excitation light. In some other embodiments, the scattering particles can also be replaced with pores of the same sizes, and total reflection is achieved based on a refractive index difference between the pore and the ceramic matrix so as to scatter the excitation light or the excited light.

In another embodiment, the light-emitting ceramic layer can also be another composite ceramic layer, and the difference between this composite ceramic layer and the above-mentioned composite ceramic layer lies in only that the ceramic matrixes are different. In the present embodiment, the ceramic matrix is a pure-phase phosphor ceramic, that is, the ceramic matrix itself has the activator and can emit the excited light under the irradiation of excitation light. The present embodiment combines the advantage of the high light-emitting efficiency of the light-emitting ceramic particles of the composite ceramic layer and the advantage of the light-emitting performance of the pure-phase phosphor ceramic by adopting both the light-emitting ceramic particles and the ceramic matrix for light emission, thereby further improving the light-emitting efficiency of the light-emitting ceramic layer. Moreover, although the ceramic matrix has a certain doping amount of the activator, the doping amount is relatively low, which can ensure that the ceramic matrix has sufficient light transmittance. Similarly, in the light-emitting ceramic layer, scattering particles or pores can be added to enhance internal scattering of the light-emitting ceramic layer.

In the present disclosure, since the light-emitting ceramic layer is different from the "phosphor glass" and "a sintered body of phosphor plus ceramic powder" in the prior art, it has excellent thermal conduction capability itself, and can make heat generated in the light-emitting ceramic layer spread rapidly, before reaching the next layer such as the thermal conductive silica-gel film layer of the present disclosure, with the light spot as the center, especially spread rapidly in a radial direction of the wavelength conversion device. In this way, heat that reaches the thermal conductive silica-gel film layer will not be too concentrated, so as to avoid a damage to the chemical structure of the silica-gel.

<Metal Reflective Layer>

The metal reflective layer is configured to reflect the excitation light passing through the light-emitting ceramic layer and the excited light emitted by the light-emitting ceramic layer, and it can be, for example, an aluminum reflective layer, a silver reflective layer, or an aluminum alloy reflective layer. Alternatively, the aluminum reflective layer, the silver reflective layer, or the aluminum alloy reflective layer can be formed by means of coating on the light-emitting ceramic layer or the substrate. In other words, the metal reflective layer may be a reflective layer coated on the light-emitting ceramic layer or the substrate, or a reflective film that is not dependent on the light-emitting ceramic layer or the substrate but exists independently.

<Silica-Gel Layer>

The silica-gel layer is configured to bond two adjacent layers, for example, the metal reflective layer and the light-emitting ceramic layer or the metal reflective layer and the substrate. The silica-gel layer includes a silica-gel layer having a high thermal conductivity. The thermal conductive silica-gel layer has a thickness of about 0.1 µm to 10 µm, and is preferably formed of transparent silica-gel having low light absorptivity. Moreover, the lower the refractive index of the silica-gel layer the better, so as to reduce loss of light in the silica-gel layer, and the excitation light and part of the excited light are reflected by total reflection between the thermal conductive silica-gel layer and the light-emitting layer.

In an embodiment, for example, the silica-gel is disposed on the metal reflective layer by dispensing, and the light-emitting ceramic layer is disposed on the metal reflective layer at an appropriate position, then the light-emitting ceramic layer is pressurized so that the silica-gel can be evenly spread between the metal reflective layer and the light-emitting ceramic layer to form the silica-gel layer for heat conduction. In addition, the metal reflective layer and the substrate may also be connected by dispensing or welding.

The present disclosure adopts the thermal conductive silica-gel layer having the above thickness for following reasons: 1) the light-emitting layer adopting the above ceramic layer can already achieve uniform temperature distribution on a backlight surface, so there is no need to further improve surface distribution of the temperature through the thermal conductive silica-gel layer; 2) it is expected that the light can reach the reflective layer through a shorter optical length, in order to avoid expanding of the light spot.

In addition, for example, in an embodiment, the heat directly spreads to the metal reflective layer after reaching the thermal conductive silica-gel layer, and transfer of the heat thereafter belongs to heat transfer in the metals, which is common knowledge and will not be repeated in the present disclosure.

<Substrate>

The substrate includes a ceramic substrate, a metal substrate, and a ceramic-metal hybrid substrate. Different substrates are selected according to different materials of the diffuse reflective layer. The substrate, in one aspect, serves as a carrying plate of the reflective layer and the light-emitting layer and, in another aspect, serves as a heat dissipation structure for the light-emitting layer.

The metal substrate includes but is not limited to a copper substrate, a copper alloy substrate, and an aluminum substrate.

The ceramic substrate is a substrate having a dense structure and does not have a porous structure, and is formed of a ceramic material such as alumina, sapphire, aluminum nitride, silicon nitride, silicon carbide, boron nitride, or beryllium oxide and the like. Thermal conductivities of these ceramic materials are above 80 W/(m·K), and melting points are basically above 2000° C. Therefore, the ceramic substrate can also withstand relatively high temperature while achieving thermal conduction. Without doubt, in a case where the requirement on the thermal conductivity of the ceramic substrate is not very high, the ceramic substrate can also be made of other types of ceramic plates.

The ceramic-metal hybrid substrate includes, for example, an aluminum-aluminum nitride substrate.

Next, specific embodiments will be described.

The wavelength conversion device in the present disclosure includes: a metal substrate, a light-emitting ceramic layer, and a metal reflective layer and a silica-gel layer that are located between the metal substrate and the light-emitting ceramic layer. Since the heat transferring process in the present disclosure does not need to pass through layer structures such as "a scattering-reflective layer", "a thermal conductive ceramic layer", "a sapphire layer" and the like in the prior art which are provided for firmly bonding with the light-emitting layer, the heat dissipation path is simplified and the heat dissipation performance is improved.

In the prior art, the thickness of the silica-gel layer on the entire wavelength conversion device needs to be controlled, so that an incidence surface of the light-emitting layer can be kept perpendicular to the light during the rotation of the entire wavelength conversion device. However, in the present disclosure, since the material of the light-emitting ceramic layer can obtain, through processes such as polishing and grounding, a surface having smaller roughness compared to the other light-emitting layers in the prior art, it can be connected to the metal reflective layer through a thinner thermal conductive silica-gel layer, so that the above-mentioned problems in the prior art can be overcome.

Hereinafter, the structure of the wavelength conversion device in the present disclosure will be described in detail by way of specific embodiments. However, those skilled in the art can understand that following embodiments are only used to illustrate the present disclosure, rather than limit the contents and scope of the present disclosure.

First, FIG. 1 is a top plan view of the color wheel wavelength conversion device adopted in the present disclosure, in which the wavelength conversion device is formed into a disk shape as a whole. In FIG. 1, the metal reflective substrate 102 and the light-emitting ceramic layer 101 constituting the wavelength conversion device are formed in a coaxial structure. The light-emitting ceramic layer 101 is formed in a ring shape and is a ceramic body formed by sintering phosphor and alumina, and specifically a ceramic body formed by sintering YAG:Ce phosphor and alumina.

Figure 2:
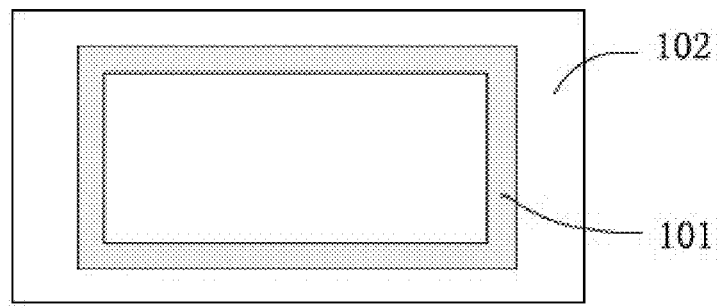
FIG. 2 is a top plan view of a fixed wavelength conversion device adopted in accordance with the present disclosure.

FIG. 2 is a top plan view of a fixed wavelength conversion device adopted in the present disclosure. In the present embodiment, a shape of the light-emitting ceramic layer 201 may be a rectangle or other shapes, and other features are the same as those in FIG. 1 and will not be repeated here.

Figure 3:
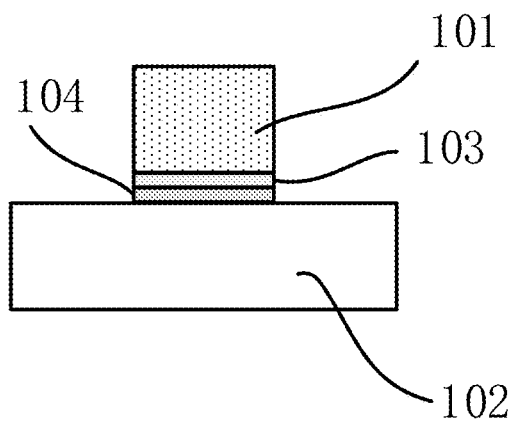
FIG. 3 is a partial cross-sectional view of a wavelength conversion device in accordance with Embodiment 1 of the present disclosure.

FIG. 3 is a partial cross-sectional view, taken along dotted lines shown in FIG. 1, of a wavelength conversion device in Embodiment 1 of the present disclosure. As shown in FIG. 3, the wavelength conversion device includes a metal substrate 102, a metal reflective layer 104, a silica-gel layer 103, and a light-emitting ceramic layer 101 that are sequentially stacked from bottom to top. The light-emitting ceramic layer 101 is a ring structure formed into one piece. The metal reflective layer 104 is provided, by coating, on a surface of the metal substrate 102 facing the silica-gel layer 101. The silica-gel layer 103 is provided between the reflective substrate 102 and the light-emitting ceramic ring 101 and configured to connect the light-emitting ceramic layer 101 with the metal substrate 102 coated with the metal reflective layer 104.

The metal substrate 102 and the metal reflective layer 104 can be formed of any material that meets requirements on heat conduction and light reflection in the present disclosure. For example, the metal substrate 102 is a copper substrate, a portion of a surface thereof not covered by the silica-gel layer is provided with an anti-oxidation layer, and the metal reflective layer 104 is a silver-aluminum reflective film layer.

Figure 4:
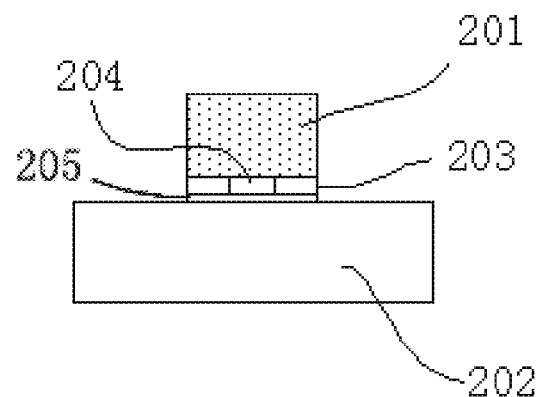
FIG. 4 is a partial cross-sectional view of a wavelength conversion device in accordance with Embodiment 2 of the present disclosure.

FIG. 4 is a partial cross-sectional view of a wavelength conversion device in Embodiment 2 of the present disclosure. Based on the top plan view of the wavelength conversion device in Embodiment 1 as shown in FIG. 1, those skilled in the art can easily know plan view structures of other embodiments of the present disclosure. Therefore, the plan views of other embodiments are omitted and only cross-sectional views taken in the same manner as in FIG. 3 are shown.

The wavelength conversion device in FIG. 4 includes a metal substrate 202, a metal reflective layer 205, a silica-gel layer 203, and a light-emitting ceramic layer 201 that are sequentially stacked from bottom to top. The difference of Embodiment 2 as shown in FIG. 4 from Embodiment 1 lies in: the thermal conductive silica-gel layer in Embodiment 2 does not completely cover the backlight surface of the light-emitting ceramic layer 201 but forms a gap 204 in the silica-gel layer. The gap 204 may be continuous or discontinuous in the silica-gel layer, surrounded by the light-emitting ceramic layer 201, the metal reflective layer 205 and the silica-gel layer 203, and distributed along the path of the light spot of the excitation light on the light-emitting ceramic layer 201.

In Embodiment 2, the light emitted by the light-emitting ceramic layer 201 can be directly incident on the metal reflective layer 205 through the gap 204. Moreover, since the heat is already uniformly distributed on the backlight surface, that is, a surface opposite to the light incidence surface, of the light-emitting ceramic layer 201, the heat can be quickly transferred to the thermal conductive silica-gel layer 203 through a surface in contact with the thermal conductive silica-gel layer 203 in the light-emitting ceramic layer 201, and then reach the metal reflective layer 205.

In Embodiment 2, since the refractive index of the gap 204 is small, which can be regarded as close to 1, light having a large incident angle and emitted from the light-emitting ceramic layer 201 can be totally reflected to face towards a light emission direction, and for the light incident on the metal reflective layer 205 through the gap 204, loss due to travelling in the thermal conductive silica-gel layer can also be avoided.

Although Embodiment 2 shown in FIG. 4 shows that the gap 204 is distributed along the path of the light spot of the excitation light on the light-emitting ceramic layer 201, the gap 204 may alternatively be disposed along a radial direction of the metal substrate 202 in the silica-gel layer 203. With such a structure, problems such as air expansion caused by a closed channel in the wavelength conversion device resulted from the gap 204 can be avoided, so that the performance of the wavelength conversion device can be further improved.

It should be noted here that FIG. 4 only shows the case where the wavelength conversion device is formed as a color wheel, that is, the metal substrate has a disk shape, but the wavelength conversion device may also be formed as a fixed wavelength conversion device having a shape such as rectangular as shown in FIG. 2. In the case of adopting the fixed wavelength conversion device, the gap 204 may be distributed along a path where the silica-gel layer is arranged on the metal substrate 202, or may be distributed in the silica-gel layer 204 in a direction towards the center of the metal substrate 202.

Figure 5:
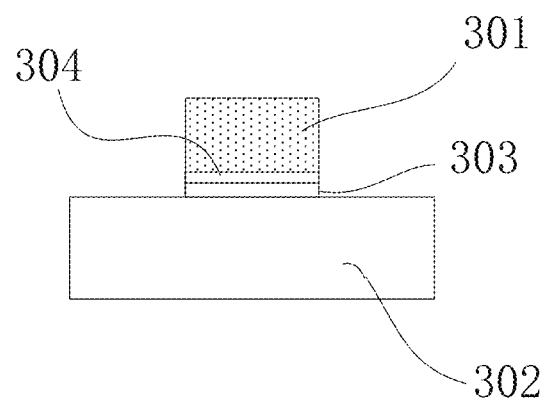
FIG. 5 is a partial cross-sectional view of a wavelength conversion device in accordance with Embodiment 3 of the present disclosure.

FIG. 5 is a partial cross-sectional view of a wavelength conversion device in Embodiment 3 of the present disclosure. In FIG. 5, the wavelength conversion device includes a metal substrate 302, a silica-gel layer 303, a metal reflective layer 304, and a light-emitting ceramic layer 301 that are sequentially stacked from bottom to top. Unlike the structure in Embodiment 1 where the metal reflective layer is coated on the surface of the metal substrate, a metal reflective layer 304 is coated on bottom of the light-emitting ceramic layer 301 in Embodiment 3.

Since the light-emitting ceramic ring is a ceramic sintered into one piece, instead of a sintered body sintered from phosphor and ceramic particles in the prior art, the surface thereof can obtain a structure having a very low roughness through polishing and smoothing, so that the metal reflective layer 304 can be better coated.

Figure 6:
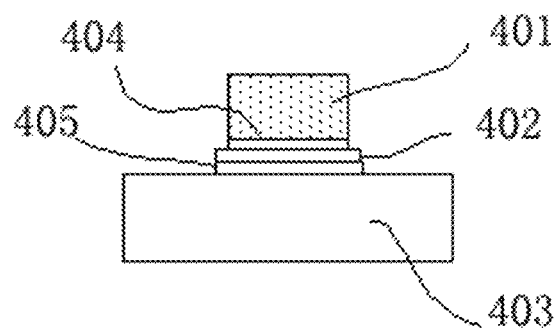
FIG. 6 is a partial cross-sectional view of a wavelength conversion device in accordance with Embodiment 4 of the present disclosure.

FIG. 6 is a partial cross-sectional view of a wavelength conversion device in Embodiment 4 of the present disclosure. As shown in FIG. 6, the wavelength conversion device includes a metal substrate 403, a first silica-gel layer 405, a metal reflective layer 402, a second silica-gel layer 404, and a light-emitting ceramic layer 401 that are sequentially stacked from bottom to top, in which the first silica-gel layer 404 is disposed between the light-emitting ceramic layer 401 and the metal reflective layer 402, the first silica-gel layer 405 is disposed between the metal reflective layer 402 and the metal substrate 403, and the silica-gel layer is configured to connect the two layers adjacent thereto.

In Embodiment 4, the metal substrate 403 is formed as a flat plate structure having a flat surface and adjacent to the first silica-gel layer 405. The first silica-gel layer 405, the metal reflective layer 402, the second silica-gel layer 404, and the light-emitting ceramic layer 401 are sequentially stacked on this flat surface.

Figure 7:
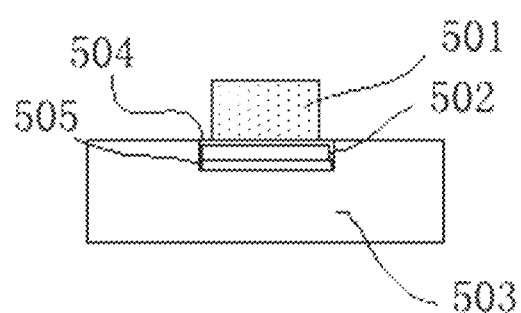
FIG. 7 is a partial cross-sectional view of a wavelength conversion device in accordance with Embodiment 5 of the present disclosure.

FIG. 7 is a partial cross-sectional view of a wavelength conversion device in Embodiment 5 of the present disclosure. Similarly, in Embodiment 5, the wavelength conversion device includes a metal substrate 503, a first silica-gel layer 505, a metal reflective layer 502, a second silica-gel layer 504, and a light-emitting ceramic layer 501 that are sequentially stacked from bottom to top. The difference of Embodiment 5 from Embodiment 4 lies in that the metal substrate 503 is formed with a groove on a surface adjacent to the first silica-gel layer 505, and the metal reflective film 502 is bonded or welded to bottom of the groove through the first silica-gel layer 505, such that the silica-gel layer 504 and the metal substrate 503 together seal the metal reflective film layer 202. With this configuration, the oxidation rate of the metal reflective layer 502 can be reduced, thereby increasing the service life of the wavelength conversion device.

Although it is shown in FIG. 7 that the second silica-gel layer 504 fills up other space in the groove except that of the first silica-gel layer 505 and the metal reflective layer 502, the second silica-gel layer 504 may not necessarily fill up the groove completely, as long as the second silica-gel layer 504 and the first silica-gel layer 505 can cover the metal reflective film layer.

In addition, although it is shown in FIG. 7 that the light-emitting ceramic layer 501 is provided above the groove in the metal substrate 203, the light-emitting ceramic layer 501 may also be formed to be partially disposed in the groove.

In the above, the structure of the wavelength conversion device in the present disclosure has been described by way of specific embodiments, however, those skilled in the art should understand that structural features related to the wavelength conversion device in the various embodiments may be adopted in combination with each other.

For example, the materials of the metal substrate and the metal reflective layer are described in Embodiment 1, but the materials can also be applied to Embodiments 2-5.

For example, it is described in Embodiment 2 that the gap is formed in the silica-gel layer, but the gap structure can also be applied to the silica-gel layer in Embodiment 3-5.

For example, the structure in which the groove is formed on the surface of the metal substrate is described in Embodiment 5, but the groove structure can also be applied to the structures of Embodiments 1-4. When the groove structure is adopted in Embodiment 2, the metal reflective layer can be sealed by the metal substrate, the silica-gel film, and the phosphor ceramic layer.

It should be understood that the description of the combination of the various features above only lists some examples of combination, which is only for illustration and not constitute limitations to the present disclosure. Those skilled in the art can also appropriately carry out combinations of other features without departing from the spirit of the present disclosure.

Those skilled in the art should understand that, based on design requirements and other factors, various modifications, combinations, sub-combinations, and alternations may be made within the scope of the claims appended to the present disclosure or equivalents thereof.

What is claimed is:

1. A wavelength conversion device, comprising:
   a metal substrate; and
   a light-emitting ceramic layer configured to absorb excitation light and emit excited light having a wavelength different from the excitation light,
   wherein a metal reflective layer and a silica-gel layer are stacked between the metal substrate and the light-emitting ceramic layer, and the metal reflective layer is configured to reflect the excited light and a part of the excitation light which is not converted.

2. The wavelength conversion device according to claim 1, wherein the metal reflective layer is a metal reflective film coated on a surface of the metal substrate facing the light-emitting ceramic layer, and the silica-gel layer is disposed between the metal reflective film and the light-emitting ceramic layer.

3. The wavelength conversion device according to claim 1, wherein the metal reflective layer is a metal reflective film coated on a surface of the light-emitting ceramic layer facing the metal substrate, and the silica-gel layer is disposed between the metal reflective film and the metal substrate.

4. The wavelength conversion device according to claim 1, wherein the silica-gel layer comprises a first film layer located between the light-emitting ceramic layer and the metal reflective layer, and a second film layer located between the metal reflective layer and the metal substrate.

5. The wavelength conversion device according to claim 1, wherein a groove is formed on the metal substrate, and a stacking body formed of the metal reflective layer, the silica-gel layer and the light-emitting ceramic layer is partially disposed in the groove in a stacking direction.

6. The wavelength conversion device according to claim 2, wherein a groove is formed on the metal substrate, and a stacking body formed of the metal reflective layer, the silica-gel layer, and the light-emitting ceramic layer is partially disposed in the groove in a stacking direction.

7. The wavelength conversion device according to claim 6, wherein the metal reflective layer is sealed by at least the silica-gel layer and the metal substrate.

8. The wavelength conversion device according to claim 1, wherein he silica-gel layer has a thickness ranging from 0.1 μm to 10 μm.

9. The wavelength conversion device according to claim 4, wherein the first film layer and the second film layer each have a thickness ranging from 0.1 μm to 10 μm.

10. The wavelength conversion device according to claim 1, wherein a continuous or discontinuous gap is formed in the silica-gel layer, and the gap is distributed along a path of the silica-gel layer arranged on the metal substrate, or distributed in the silica-gel layer in a direction towards a center of the metal substrate.

11. The wavelength conversion device according to claim 1, wherein the light-emitting ceramic layer is a ceramic formed into one piece.

* * * * *